(12) United States Patent
Basker et al.

(10) Patent No.: US 10,062,785 B2
(45) Date of Patent: Aug. 28, 2018

(54) FIN FIELD-EFFECT TRANSISTOR (FINFET) WITH REDUCED PARASITIC CAPACITANCE

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/583,310

(22) Filed: May 1, 2017

(65) Prior Publication Data
US 2017/0236933 A1 Aug. 17, 2017

Related U.S. Application Data

(63) Continuation of application No. 14/984,201, filed on Dec. 30, 2015, now Pat. No. 9,716,042.

(51) Int. Cl.
| | |
|---|---|
| *H01L 29/78* | (2006.01) |
| *H01L 29/06* | (2006.01) |
| *H01L 29/417* | (2006.01) |
| *H01L 29/66* | (2006.01) |
| *H01L 21/8234* | (2006.01) |
| *H01L 27/088* | (2006.01) |

(52) U.S. Cl.
CPC .... *H01L 29/785* (2013.01); *H01L 21/823431* (2013.01); *H01L 27/0886* (2013.01); *H01L 29/0649* (2013.01); *H01L 29/0657* (2013.01); *H01L 29/41791* (2013.01); *H01L 29/66545* (2013.01); *H01L 29/66795* (2013.01)

(58) Field of Classification Search
CPC .......... H01L 21/02164; H01L 21/0217; H01L 21/0332; H01L 21/823431; H01L 21/823481; H01L 21/845; H01L 27/0886; H01L 27/1211; H01L 29/0649; H01L 29/0657; H01L 29/1083; H01L 29/41791; H01L 29/66545; H01L 29/66795; H01L 29/785
USPC ......... 257/288, 368, 369; 438/151, 197, 199
See application file for complete search history.

(56) References Cited

U.S. PATENT DOCUMENTS

| | | |
|---|---|---|
| 7,863,136 B2 | 1/2011 | Goldbach et al. |
| 8,836,046 B2 | 9/2014 | Maeda et al. |

(Continued)

OTHER PUBLICATIONS

List of IBM Patents or Patent Applications Treated as Related.

*Primary Examiner* — Shahed Ahmed
(74) *Attorney, Agent, or Firm* — Vazken Alexanian; Ryan, Mason & Lewis, LLP

(57) ABSTRACT

A semiconductor device includes a substrate, a plurality of fins on the substrate, wherein the plurality of fins each include a fin channel region, first isolation regions on the substrate corresponding to active gate regions, a second isolation region on the substrate corresponding to a dummy gate region, wherein a height of the second isolation region is greater than a height of the first isolation regions, a plurality of active gate structures formed around the fins, and on the first isolation regions, and a dummy gate structure formed on the second isolation region.

18 Claims, 8 Drawing Sheets

(56) References Cited

U.S. PATENT DOCUMENTS

| | | |
|---|---|---|
| 8,846,491 B1 | 9/2014 | Pham et al. |
| 9,034,701 B2 | 5/2015 | Cheng et al. |
| 9,040,363 B2 | 5/2015 | Basker et al. |
| 9,112,031 B2 | 8/2015 | Leobandung |
| 9,123,773 B1 | 9/2015 | Shen et al. |
| 2008/0128797 A1 | 6/2008 | Dyer et al. |
| 2010/0276756 A1 | 11/2010 | Rachmady et al. |
| 2011/0068431 A1 | 3/2011 | Knorr et al. |
| 2015/0050792 A1 | 2/2015 | Samavedam et al. |
| 2015/0115373 A1 | 4/2015 | Yu et al. |
| 2016/0111336 A1 | 4/2016 | Chang et al. |
| 2017/0141211 A1* | 5/2017 | Xie .................. H01L 29/66545 |
| 2017/0148881 A1* | 5/2017 | Zhu ...................... H01L 29/401 |

* cited by examiner

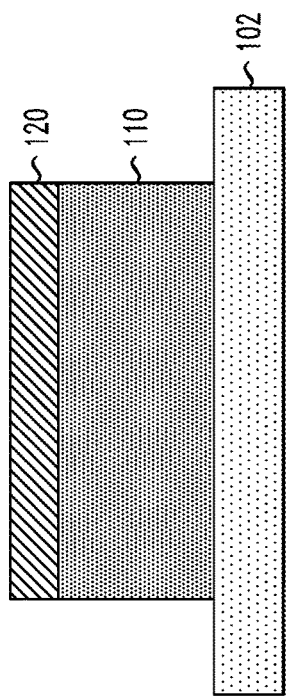
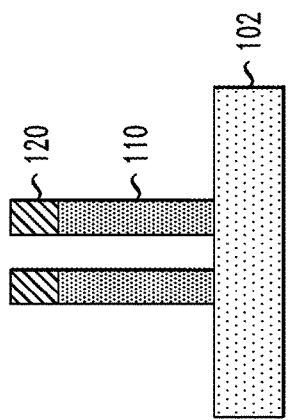
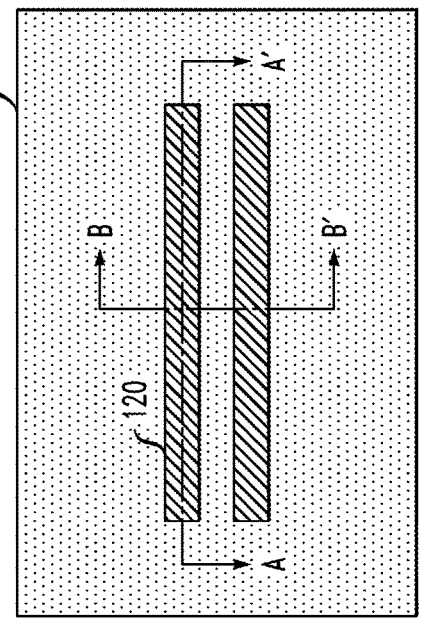
FIG. 1B
FIG. 1C
FIG. 1A

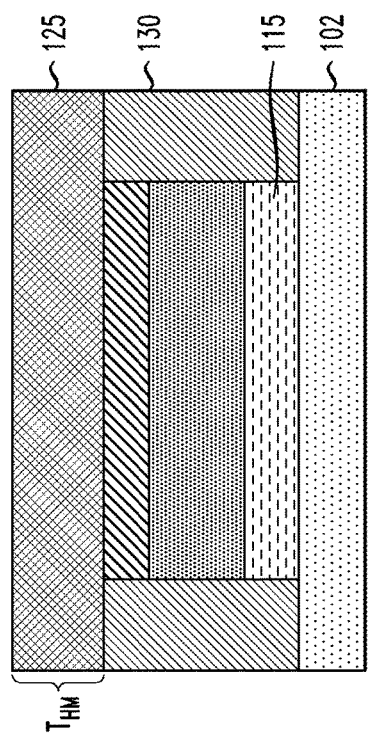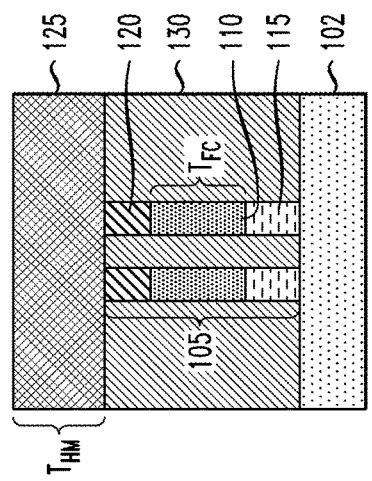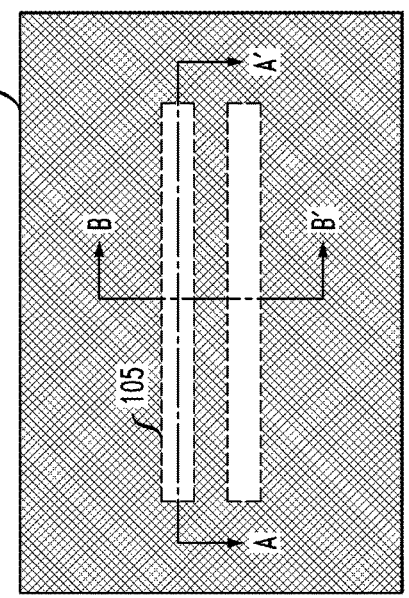

FIN FIELD-EFFECT TRANSISTOR (FINFET) WITH REDUCED PARASITIC CAPACITANCE

TECHNICAL FIELD

The field generally relates to semiconductor devices and methods of manufacturing same and, in particular, to a semiconductor device including an improved configuration for a diffusion break.

BACKGROUND

Fin field-effect transistor (FinFET) devices include a transistor architecture that uses raised source-to-drain channel regions, referred to as fins. A FinFET device can be built on a semiconductor substrate, where a semiconductor material, such as silicon, is patterned into a fin-like shape and functions as the channel of the transistor.

Semiconductor devices may include multiple FinFETs positioned adjacent each other on a buried insulating layer (e.g. buried oxide layer (BOX)) or a shallow trench isolation (STI) layer of a substrate. More specifically, each FinFET on a substrate may include an active gate extending perpendicular to and around one or more fins. Source/Drain regions are located at fin ends along a channel length direction on either side of the active gate. Known semiconductor devices may employ a dummy gate in a fin cut region between the adjacent FinFETs in order to create a diffusion break. The fin cut region can include a break in fin located at a space between adjacent FinFETs, for example, between a drain of a first transistor and a source of a second adjacent transistor.

In known semiconductor devices, the dummy gate creating the diffusion break between two FinFETs extends all the way down to a buried insulating layer or STI layer so that the dummy gate is positioned between the source/drain regions of the neighboring FinFETs, thereby forming parasitic capacitors with the source/drain regions, which degrades circuit performance and consumes power.

SUMMARY

According to an exemplary embodiment of the present invention, a method for manufacturing a semiconductor device includes forming a first hardmask on a semiconductor layer of a substrate, patterning the semiconductor layer into a plurality of fins, depositing a first isolation material layer on the substrate and on sides of the fins, depositing a second hardmask on the first isolation material layer, and on the plurality of fins including the first hardmask thereon, removing a portion of the second hardmask and portions of the plurality of fins including the first hardmask thereon under the portion of the second hardmask to expose an area of the substrate, and create an opening, depositing a second isolation material layer in the opening on the exposed area of the substrate, wherein a height of the second isolation material layer is greater than a height of the first isolation material layer, removing the first and second hardmask layers, removing part of the first isolation material layer to result in a top surface of the first isolation material layer being adjacent bottom portions of fin channel regions, creating first isolation regions on the substrate, removing part of the second isolation material layer to result in a top surface of the second isolation material layer being adjacent top portions of the fin channel regions, creating a second isolation region on the substrate, wherein a height of the second isolation region is greater than a height of the first isolation regions, forming active gate structures around the fins, and on the first isolation regions, and forming a dummy gate structure on the second isolation region.

According to an exemplary embodiment of the present invention, a semiconductor device includes a substrate, a plurality of fins on the substrate, wherein the plurality of fins each include a fin channel region, first isolation regions on the substrate corresponding to active gate regions, a second isolation region on the substrate corresponding to a dummy gate region, wherein a height of the second isolation region is greater than a height of the first isolation regions, a plurality of active gate structures formed around the fins, and on the first isolation regions, and a dummy gate structure formed on the second isolation region.

According to an exemplary embodiment of the present invention, a method for manufacturing a semiconductor device includes forming a first hardmask on a semiconductor layer of a substrate, patterning the semiconductor layer into a plurality of fins, depositing a first isolation material layer on the substrate and on sides of the fins, depositing a second hardmask on the first isolation material layer, and on the plurality of fins including the first hardmask thereon, removing a portion of the second hardmask and portions of the plurality of fins including the first hardmask thereon under the portion of the second hardmask to expose an area of the substrate, and create an opening, depositing a second isolation material layer in the opening on the exposed area of the substrate, wherein a height of the second isolation material layer is greater than a height of the first isolation material layer, removing the first and second hardmask layers, removing part of the first isolation material layer to create first isolation regions on the substrate, removing part of the second isolation material layer to create a second isolation region on the substrate, wherein a height of the second isolation region is greater than a height of the first isolation regions, forming active gate structures around the fins, and on the first isolation regions, and forming a dummy gate structure on the second isolation region.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 1A is a top view illustrating formation of continuous fins on a semiconductor substrate in a method for manufacturing a semiconductor device, according to an exemplary embodiment of the present invention.

FIGS. 1B and 1C are respective cross-sectional views taken along lines A-A' and B-B' in FIG. 1A, and illustrating formation of the continuous fins on the semiconductor substrate, according to an exemplary embodiment of the present invention.

FIG. 3A is a top view illustrating deposition of a second hardmask in a method for manufacturing a semiconductor device, according to an exemplary embodiment of the present invention.

FIGS. 3B and 3C are respective cross-sectional views taken along lines A-A' and B-B' in FIG. 3A, and illustrating deposition of the second hardmask, according to an exemplary embodiment of the present invention.

DETAILED DESCRIPTION

Figure 2B:
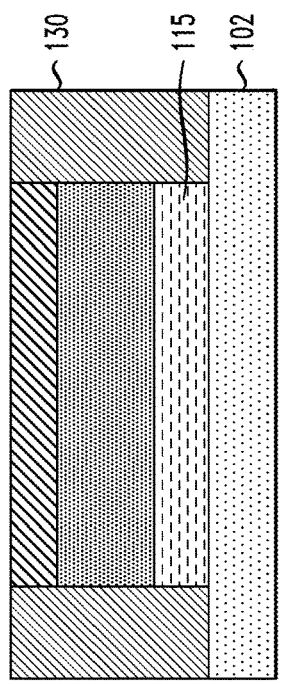
FIGS. 2B and 2C are respective cross-sectional views taken along lines A-A' and B-B' in FIG. 2A, and illustrating formation of the isolation material layer and doping below the fin channel, according to an exemplary embodiment of the present invention.

Exemplary embodiments of the invention will now be discussed in further detail with regard to semiconductor devices and methods of manufacturing same and, in particular, to a semiconductor device including an improved configuration for a diffusion break.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "parallel to a gate extension direction" refers to an extension direction of a gate structure perpendicular to a channel length (e.g., perpendicular to a fin extension direction). In the figures, the cross-sections along lines B-B' are taken parallel to a gate extension direction. Left and right the cross-sections along lines B-B' represent a gate extension direction and a width direction of the fins, and a length of a fin and a channel length are going into the page.

As used herein, "perpendicular to a gate extension direction" or "across a channel of a gate structure" refers to a channel length direction of a gate structure (e.g., parallel to a fin extension direction). In the figures, the cross-sections along lines A-A' are taken perpendicular to a gate extension direction. Left and right the cross-sections along lines A-A' represent a length of a fin and a channel length, and the width direction of the fin and a gate extension direction are going into the page.

As used herein, "vertical" refers to a direction perpendicular to a substrate in top and cross-sectional views.

As used herein, "horizontal" refers to a direction parallel to a substrate in top and cross-sectional views.

As used herein, "thickness" refers to a vertical size of an element (e.g., a layer, trench, hole, etc.) in the cross-sectional views measured from a bottom surface to a top surface of the element, and/or measured with respect to a surface on which the element is directly on.

Unless otherwise specified, as used herein, "height" or "height above a substrate" refers to a vertical size of an element (e.g., a layer, trench, hole, etc.) in the cross-sectional views measured from a top surface of the substrate 102 to a top surface of the element. The thickness of an element can be equal to the height of the element if the element is directly on the substrate.

As used herein, "lateral," "lateral side," "lateral surface" refers to a side surface of an element (e.g., a layer, opening, etc.), such as a left or right side surface in the top and cross-sectional views.

As used herein, "width" or "length" refers to a size of an element (e.g., a layer, trench, hole, etc.) in the figures measured from a side surface to an opposite surface of the element.

Embodiments of the present invention provide a semiconductor device and method for manufacturing the same, wherein dummy gate providing a diffusion break is positioned above adjacent source/drain regions to reduce parasitic capacitance. In accordance with an embodiment of the present invention, the dummy gate does not extend down a buried insulating layer or STI between the adjacent source/drain regions.

According to an embodiment, as explained in further detail below, a second hardmask layer is deposited before fin cutting step in order to create an offset of isolation region height between a fin cut region and an active fin region. After recessing isolation material layers, the isolation region in the fin cut region is taller than the isolation region in the active fin region, so that a later formed dummy gate in the fin cut region does not overlap with the adjacent source/drain regions of the active FinFETs. A same isolation material can be used in both fin cut and active fin regions, but a taller isolation region height in the fin cut region than that in the active FinFET region positions the dummy gate above adjacent source/drain regions to reduce parasitic capacitance.

FIG. 1A is a top view illustrating formation of continuous fins on a semiconductor substrate in a method for manufacturing a semiconductor device, according to an exemplary embodiment of the present invention. FIGS. 1B and 1C are respective cross-sectional views taken along lines A-A' and B-B' in FIG. 1A, and illustrating formation of the continuous fins on the semiconductor substrate, according to an exemplary embodiment of the present invention.

As is known in the art, a fin of a FinFET can include, for example, silicon, and is a conducting channel that protrudes vertically from a substrate and extends in a direction from a source to a drain. As can be understood by one of ordinary skill in the art, a plurality of fins can be formed on the substrate 102 and spaced apart from each other at regular intervals along a gate extension direction. A plurality of gates can intersect the fins and extend perpendicular to the extension direction of the fins. Multiple gates can be spaced apart from each other along the extension direction of the fins.

Referring to FIGS. 1A-1C, a semiconductor substrate 102 can be, for example, a bulk substrate or a silicon-on-insulator (SOI) substrate including a buried insulating layer, such as, for example, a buried oxide or nitride layer located on an upper surface of the semiconductor substrate. The substrate 102 may include semiconductor material including, but not limited to, Si, SiGe, SiC, SiGeC or other like semiconductor. In addition, multiple layers of the semiconductor materials can be used as the semiconductor material of the substrate.

In accordance with an embodiment of the present invention, as can be seen in FIGS. 1A-1C fins 110 are formed on the substrate 102, using, for example, known methods of epitaxial growth and patterning. Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

Fins, such as fin 110, can be formed by patterning an SOI layer, or a top portion of a bulk substrate if one is used into the fins 110. The SOI layer may include semiconductor material including, but not limited to, Si, SiGe, SiC, SiGeC or other like semiconductor. In addition, multiple layers of the semiconductor materials can be used as the semiconductor material of the SOI layer. A hardmask 120 including, for example, a dielectric material, such as silicon nitride (SiN) is formed on portions that are to be formed into the fins 110. The fin patterning can be done by a spacer image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography defined mandrel to spacers, where the pattern density is doubled. The spacer pattern can be used as the hardmask 120 to form the fins by RIE processes.

Figure 2C:
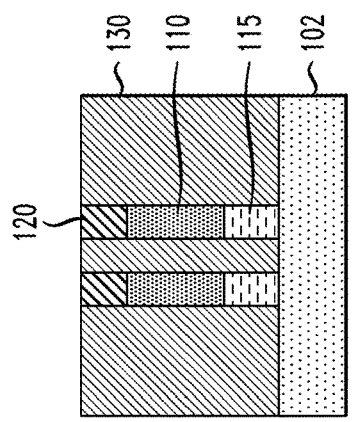
Figure 2A:
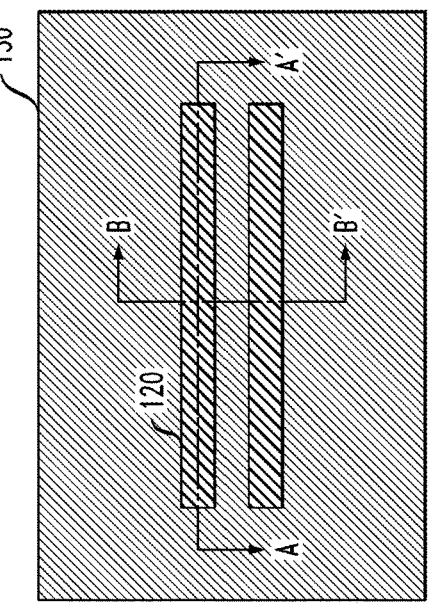
FIG. 2A is a top view illustrating formation of an isolation material layer and doping below a fin channel in a method for manufacturing a semiconductor device, according to an exemplary embodiment of the present invention.

FIG. 2A is a top view illustrating formation of an isolation material layer and doping below a fin channel in a method for manufacturing a semiconductor device, according to an exemplary embodiment of the present invention. FIGS. 2B and 2C are respective cross-sectional views taken along lines A-A' and B-B' in FIG. 2A, and illustrating formation of the isolation material layer and doping below the fin channel, according to an exemplary embodiment of the present invention. Referring to FIGS. 2A-2C, an isolation material, such as, for example, a dielectric material, including, but not limited to silicon dioxide ($SiO_2$), low-temperature oxide (LTO), high-temperature oxide (HTO), field oxide (FOX) or some other dielectric, is deposited on exposed areas of the substrate 102 to form isolation material layers 130, which are eventually patterned to form isolation regions, such as, for example, shallow trench isolation (STI) regions. As can be seen in FIGS. 2A-2C, the isolation material layers 130 are positioned on the substrate 102 on sides of the fins 110 including the hardmask 120 thereon. The isolation material can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating, followed by a planarization process, such as, chemical mechanical planarization (CMP) to remove excess isolation material. Referring to FIGS. 2B and 2C, the resulting structure has a planarized top surface.

A punchthrough stop (PTS) doping process is also performed to create a PTS doped region 115 of each fin 110 at a lower portion of the fin 110 on the substrate 102. As can be seen with reference to FIG. 8C, described further below, the PTS doped region is located below the portion of the fin 110 including the conducting channel between the source and drain (i.e., fin channel), around which the gate(s) are formed. The PTS doped regions 115 are doped differently from the source/drain regions in order to prevent leakage current. For example, in a non-limiting illustrative example, the doping of the PTS regions 115 uses, for example, arsenic (As) or phosphorous (P) for a p-type FET (pFET) and boron (B) for an n-type FET (nFET), at concentrations in the general range of e18/cm$^3$ to stop the leakage. The doping of the source/drain regions (see FIG. 8B) includes, for example, As or P for an nFET, and B for a pFET, at concentrations in the general range of e20/cm$^3$.

FIG. 3A is a top view illustrating deposition of a second hardmask in a method for manufacturing a semiconductor device, according to an exemplary embodiment of the present invention. FIGS. 3B and 3C are respective cross-sectional views taken along lines A-A' and B-B' in FIG. 3A, and illustrating deposition of the second hardmask, according to an exemplary embodiment of the present invention. Referring to FIGS. 3A-3C, stacked structures 105 on the substrate 102 include respective PTS doped regions 115 of the fins 110, remaining portions of the fins 110 including the fin channel regions, and hardmasks 120 on top of the fins 110.

As shown in FIGS. 3A-3C another hardmask 125, which can include the same material (e.g., SiN) as the hardmask 120, or another dielectric material, is deposited on the structure including the isolation material layers 130 and the stacked structures 105. According to an embodiment, the thickness ($T_{HM}$) of the hardmask 125 is equal or substantially equal to what will be the thickness of the fin channel regions ($T_{FC}$) in the resulting device. The reason for the thickness $T_{HM}$ being equal or substantially equal to the thickness $T_{FC}$ is to form an isolation material layer in a fin cut region that is taller than the isolation material layers 130. Therefore, after etching to create the isolation regions, the resulting isolation region in the fin cut region will end up being taller (i.e., having a greater height above the substrate) than the resulting isolation regions in the active regions. The hardmask 125 can be deposited using deposition techniques including, but not limited to, CVD, PECVD, RFCVD, PVD, ALD, MBD, PLD, and/or LSMCD, sputtering, and/or plating.

Figure 4B:
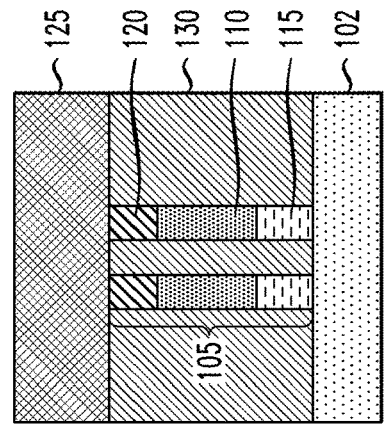
FIGS. 4B and 4C are respective cross-sectional views taken along lines A-A' and B-B' in FIG. 4A, and illustrating the hardmask and fin cut, according to an exemplary embodiment of the present invention.
Figure 4C:
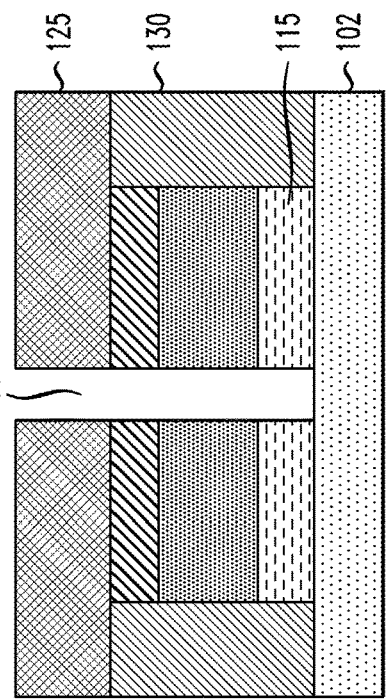
Figure 4A:
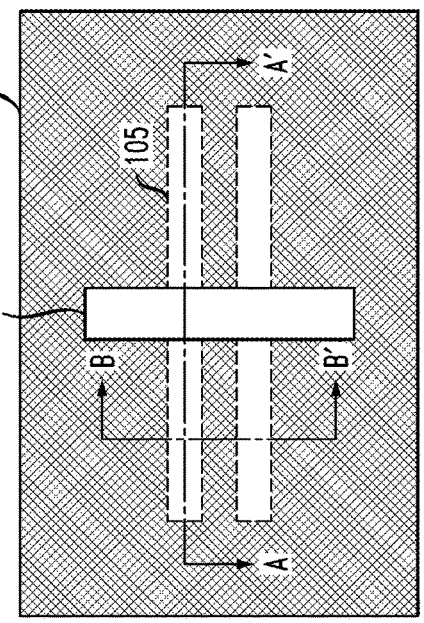
FIG. 4A is a top view illustrating a hardmask and fin cut in a method for manufacturing a semiconductor device, according to an exemplary embodiment of the present invention.

FIG. 4A is a top view illustrating a hardmask and fin cut in a method for manufacturing a semiconductor device, according to an exemplary embodiment of the present invention. FIGS. 4B and 4C are respective cross-sectional views taken along lines A-A' and B-B' in FIG. 4A, and illustrating the hardmask and fin cut, according to an exemplary embodiment of the present invention. Referring to FIGS. 4A-4C, according to an embodiment, a lithography process can be used cut second hardmask 125 and the stacked structures 105 each including the first hardmask 120, the remaining portion of the fin 110 and the PTS doped region 115 of the fin 110, in a direction perpendicular to an extension direction of the fins 110 to result in the removal of portions (e.g., central portions corresponding to a dummy gate region) of the hardmask 125 and the stacked structures 105 down to the substrate 102. The lithography can have 3 layers, including, from a top, a photoresist layer, a silicon-containing antireflection coating (SiARC), and an organic planarization layer (OPL). The lithography pattern can be transferred using exposure/development steps from mask to photoresist. Then, RIE steps are used to open the SiARC and OPL, and etch the central portions of the hardmask 125 and the stacked structures 105 down to the substrate 102 to form an opening 150. The area including the opening 150 will form a dummy gate region between two active FinFETs.

Figure 5B:
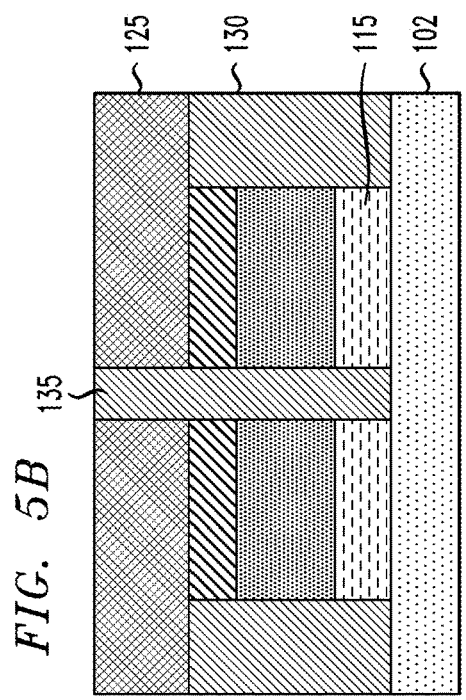
FIGS. 5B and 5C are respective cross-sectional views taken along lines A-A' and B-B' in FIG. 5A, and illustrating filling of the hardmask and fin cut opening, according to an exemplary embodiment of the present invention.
Figure 5C:
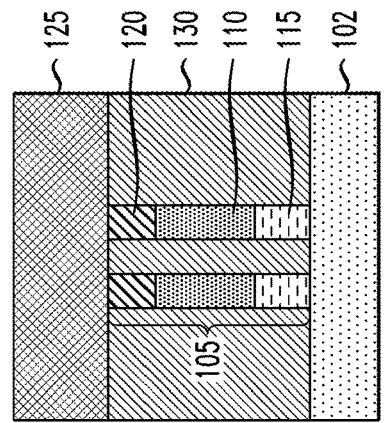
Figure 5A:
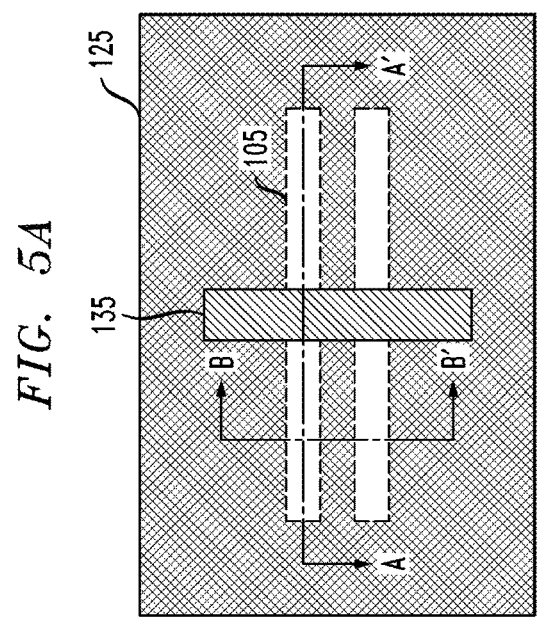
FIG. 5A is a top view illustrating filling of the hardmask and fin cut opening in a method for manufacturing a semiconductor device, according to an exemplary embodiment of the present invention.

FIG. 5A is a top view illustrating filling of the hardmask and fin cut opening in a method for manufacturing a semiconductor device, according to an exemplary embodiment of the present invention. FIGS. 5B and 5C are respective cross-sectional views taken along lines A-A' and B-B' in FIG. 5A, and illustrating filling of the hardmask and fin cut opening, according to an exemplary embodiment of the present invention. Referring to FIGS. 5A-5C, an isolation material, which can be the same as the isolation material used to form the isolation material layers 130, includes, but is not limited to, $SiO_2$, LTO, HTO, FOX or some other dielectric, is deposited in the opening 150 on the exposed area of the substrate 102 to form isolation material layer 135. Isolation material layer 135 is eventually patterned to form an isolation region, such as, for example, an STI region, in a dummy gate region. As can be seen in FIGS. 5A-5B, the isolation material layer 135 fills the opening 150 created by the removal of the central portions of the hardmask 125 and the stacked structures 105. The isolation material can be deposited using deposition techniques including, but not limited to, CVD, PECVD, RFCVD, PVD, ALD, MBD, PLD, and/or LSMCD, sputtering, and/or plating, followed by a planarization process, such as, CMP to remove excess isolation material. Referring to FIGS. 5B and 5C, the resulting structure has a planarized top surface.

Figure 6B:
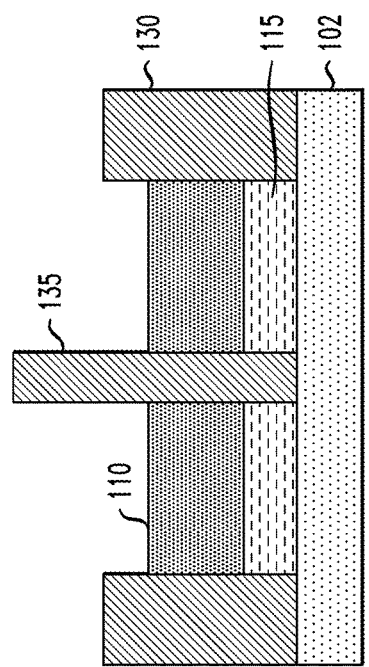
FIGS. 6B and 6C are respective cross-sectional views taken along lines A-A' and B-B' in FIG. 6A, and illustrating stripping of the hardmask layers, according to an exemplary embodiment of the present invention.
Figure 6C:
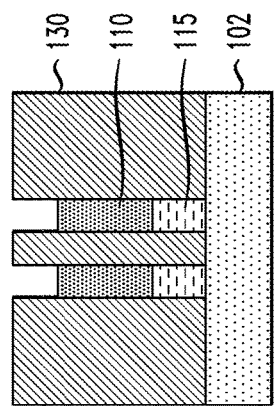
Figure 6A:
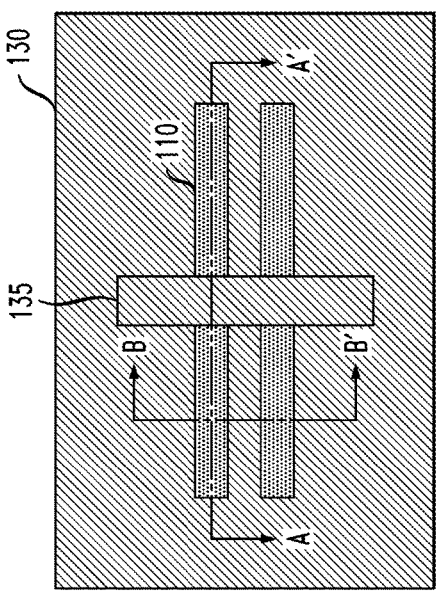
FIG. 6A is a top view illustrating stripping of hardmask layers in a method for manufacturing a semiconductor device, according to an exemplary embodiment of the present invention.

FIG. 6A is a top view illustrating stripping of hardmask layers in a method for manufacturing a semiconductor device, according to an exemplary embodiment of the present invention. FIGS. 6B and 6C are respective cross-sectional views taken along lines A-A' and B-B' in FIG. 6A, and illustrating stripping of the hardmask layers, according to an exemplary embodiment of the present invention. Referring to FIGS. 6A-6C, the hardmask layers 120 and 125 are stripped using, for example, an $H_4PO_3$ solution. As can be seen, the hardmask layers 120 are removed from the stacked structures 105, and the hardmask layer 125 is removed from on top of the isolation material layers 130 and the stacked structures 105, and from around the isolation material layer 135. As shown in FIG. 6B, the resulting isolation material layer 135 is taller (i.e., has a greater height above the substrate) than the isolation material layers 130.

Figure 7B:
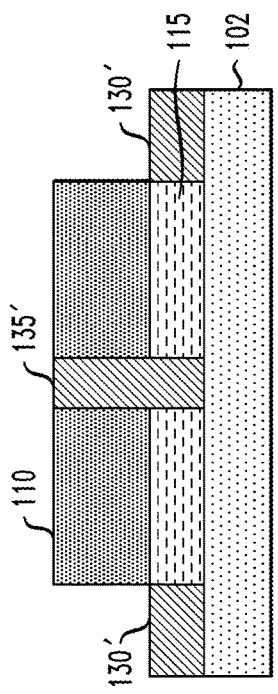
FIGS. 7B and 7C are respective cross-sectional views taken along lines A-A' and B-B' in FIG. 7A, and illustrating recessing of the isolation material layers, according to an exemplary embodiment of the present invention.
Figure 7C:
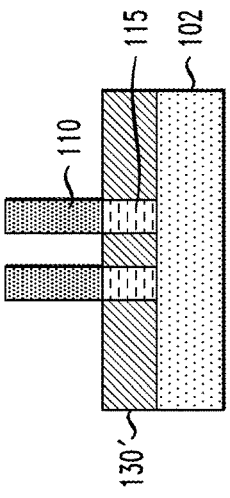
Figure 7A:
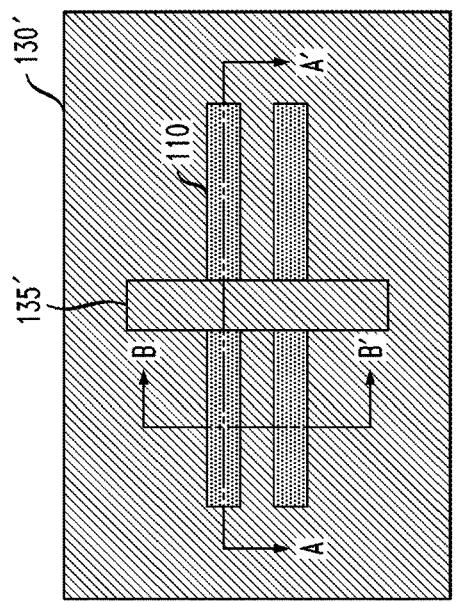
FIG. 7A is a top view illustrating recessing of isolation material layers in a method for manufacturing a semiconductor device, according to an exemplary embodiment of the present invention.

FIG. 7A is a top view illustrating recessing of isolation material layers in a method for manufacturing a semiconductor device, according to an exemplary embodiment of the present invention. FIGS. 7B and 7C are respective cross-sectional views taken along lines A-A' and B-B' in FIG. 7A, and illustrating recessing of the isolation material layers, according to an exemplary embodiment of the present invention. Referring to FIGS. 7A-7C, the isolation material layers 135 and 130 are recessed to form isolation regions 130' and 135'. As can be understood from FIGS. 6B and 7B, the isolation material layers 130 and 135 are reduced in height by an amount equal to or substantially equal to a thickness of the removed hardmask 120 and a thickness of the fin channel regions ($T_{FC}$). Referring back to FIG. 3B, since the thickness ($T_{HM}$) of the hardmask 125 was equal or substantially equal to the thickness of the fin channel regions ($T_{FC}$), the height of the isolation material layer 135 over the hardmask 120 equals or is substantially equal to the thickness of the fin channel regions ($T_{FC}$). As result, when recessed with the shorter isolation material layer 130 in the same removal process (e.g., removed at a same time), the taller isolation material layer 135 is recessed down to a top surface of the fin 110 (e.g., to a top surface of the fin channel regions), while the isolation material layer 130 is recessed farther down to a top surface of the PTS doping regions 115 (e.g., to a bottom of the fin channel regions). Accordingly, the isolation region 135' of a dummy gate region, where a diffusion break is to be formed, is at a greater height over the substrate 102 (i.e., taller) than the isolation regions 130' of the active gate regions.

Recessing of the isolation material layers 130 and 135 can be performed using for example, wet etching with Hydrofluoric Acid (HF) solution, or buffered Hydrofluoric Acid (BHF) solution, or an ammonia ($NH_3$)/HF based dry etching process.

Figure 8C:
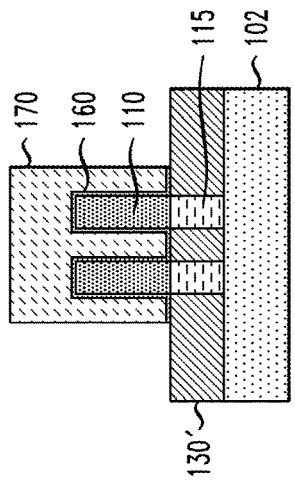
FIGS. 8B and 8C are respective cross-sectional views taken along lines A-A' and B-B' in FIG. 8A, and illustrating the gate formation, according to an exemplary embodiment of the present invention.
Figure 8B:
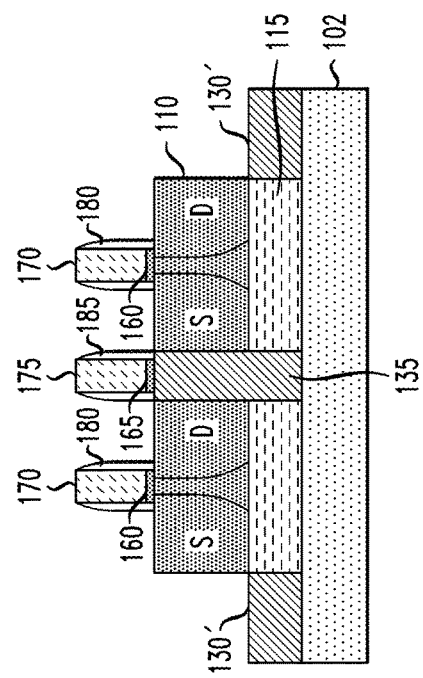
Figure 8A:
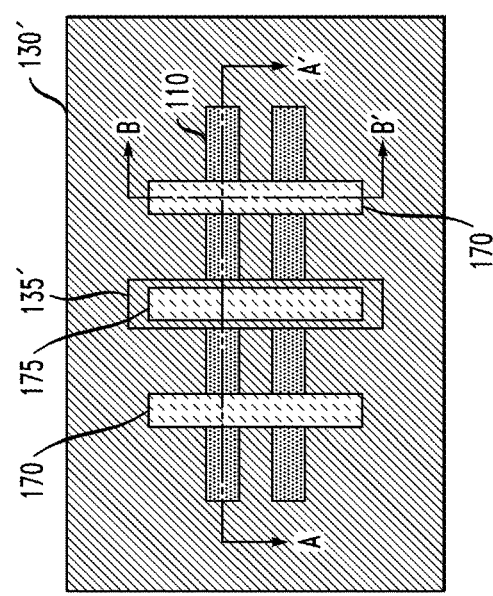
FIG. 8A is a top view illustrating gate formation in a method for manufacturing a semiconductor device, according to an exemplary embodiment of the present invention.

FIG. 8A is a top view illustrating gate formation in a method for manufacturing a semiconductor device, according to an exemplary embodiment of the present invention. FIGS. 8B and 8C are respective cross-sectional views taken along lines A-A' and B-B' in FIG. 8A, and illustrating the gate formation, according to an exemplary embodiment of the present invention. Referring to FIGS. 8A-8C, active gate structures including a dielectric 160 and a gate metal 170 are formed around the fins 110 including the fin channel regions, and over the isolation and PTS doping regions 130' and 115. A dummy gate structure including a dielectric 165 and a gate metal 175 is formed on the isolation region 135'. As can be seen in FIG. 8B, the isolation region 135' prevents the dummy gate metal 175 from extending downward between source/drain regions (annotated "D" and "S" in FIG. 8B) of adjacent active FinFETs, thereby preventing or, at the very least, substantially reducing the occurrence of a parasitic capacitor between the dummy gate 175 and the adjacent source/drain regions. Accordingly, the embodiments of the present invention result in an improved structure for a diffusion break.

The gate structures can be formed by a replacement metal gate (RMG) process. In an RMG process, sacrificial material, which is replaced by metal gates, is used to determine a geometry and location of the resulting metal gates. The sacrificial gates can include a material that can be selectively etched with respect to adjacent layers. For example, the sacrificial gates may include silicon, such as, polysilicon, and may be deposited and patterned. The sacrificial gates can be deposited using deposition techniques including, but not limited to, CVD, PECVD, RFCVD, PVD, ALD, MBD, PLD, and/or LSMCD, sputtering, and/or plating.

During the RMG process, spacers 180 and 185 are formed adjacent to the sacrificial gates, to be in direct contact with opposing sidewalls of the sacrificial gates. The spacers 180, 185 can include a dielectric insulating material such as, for example, silicon oxide, silicon nitride, silicon oxynitride, boron nitride, silicon boron nitride, or multilayered stacks thereof.

Dielectric layer 160, 165, including, for example, $SiO_2$, LTO, HTO, FOX, $HfO_2$ (hafnium oxide), $ZrO_2$ (zirconium dioxide), hafnium zirconium oxide $Al_2O_3$ (aluminum oxide), and $Ta_2O_5$ (tantalum pentoxide) or some other dielectric, are formed, in the case of dielectric 160, on and around the fin 110 and on the isolation region 130', and in the case of the dielectric 165, on the isolation region 135' using a deposition process. The deposition process can be, for example, CVD, PECVD, RFCVD, PVD, ALD, MBD, PLD, and/or LSMCD.

The sacrificial gates are removed to provide openings exposing the dielectric 160, 165, and in which the resulting metal gates are to be formed. The sacrificial gates can be removed using a selective etch process that selectively removes the sacrificial gates with respect to the dielectric layers 160, 165 and spacers 180, 185. The etch can be, for example, an isotropic etch, such as a wet chemical etch, or an anisotropic etch, such as RIE, ion beam etching, plasma etching or laser ablation.

Metal gates 170, 175 are formed in the openings left after removal of the sacrificial gates. The metal gates 170, 175 include, for example, low resistance metal, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof. The metal gates may be formed using, for example, deposition techniques including, but not limited to, CVD, PECVD, RFCVD, PVD, ALD, MBD, PLD, and/or LSMCD, sputtering, and/or plating. The spacers 180, 185 are located on the metal gates, having a first edge located on a vertical sidewall the gates and, in the case of spacers 180, a base that is located on the fin 110, and in the case of the spacers 185, a base that is located on the isolation region 135'.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
   a substrate;
   a plurality of fins on the substrate, wherein the plurality of fins each comprise a fin channel region;
   first isolation regions on the substrate corresponding to active gate regions;
   a second isolation region on the substrate corresponding to a dummy gate region, wherein a height of the second isolation region is greater than a height of each of the first isolation regions;
   a plurality of active gate structures formed around the plurality of fins, and on the first isolation regions; and
   a dummy gate structure formed on the second isolation region;
   wherein the second isolation region has a top surface adjacent to and at the same or substantially the same height as a top surface of the fin channel regions.

2. The semiconductor device according to claim 1, wherein the first isolation regions have top surfaces adjacent bottom portions of the fin channel regions.

3. The semiconductor device according to claim 1, wherein the plurality of fins each comprise a punchthrough stop (PTS) doped region under the fin channel region of each of the fins.

4. The semiconductor device according to claim 3, wherein the punchthrough stop (PTS) doped region of each of the fins is doped differently than source/drain regions of transistors of the active gate regions.

5. The semiconductor device according to claim 3, wherein the second isolation region is positioned between source/drain regions of adjacent transistors of the active gate regions, and between punchthrough stop (PTS) doped regions respectively corresponding to the adjacent transistors.

6. The semiconductor device according to claim 1, wherein a difference between the height of the second isolation region and the height of each of the first isolation regions is equal to or substantially equal to a thickness of the fin channel regions.

7. The semiconductor device according to claim 1, wherein the second isolation region is positioned between source/drain regions of adjacent transistors of the active gate regions.

8. The semiconductor device according to claim 7, wherein a height of the second isolation region with respect to the substrate is equal to or substantially equal to a height of each of the plurality of fins with respect to the substrate.

9. The semiconductor device according to claim 1, wherein the first and second isolation regions comprise at least one of silicon dioxide ($SiO_2$), low-temperature oxide (LTO), high-temperature oxide (HTO) and field oxide (FOX).

10. A semiconductor device, comprising:
a substrate;
a plurality of fins on the substrate, wherein each fin of the plurality of fins is divided into at least two active gate regions;
an isolation region on the substrate corresponding to a dummy gate region, wherein the isolation region is positioned between source/drain regions of adjacent active gate regions of each fin of the plurality of fins;
a plurality of active gate structures formed around the plurality of fins; and
a dummy gate structure formed on the isolation region;
wherein the isolation region has a top surface adjacent to and at the same or substantially the same height as a top surface of the source/drain regions.

11. The semiconductor device according to claim 10, wherein the plurality of fins each comprise a fin channel region.

12. The semiconductor device according to claim 11, wherein the plurality of fins each comprise a punchthrough stop (PTS) doped region under the fin channel region of each of the fins.

13. The semiconductor device according to claim 12, wherein the punchthrough stop (PTS) doped region of each of the fins is doped differently than the source/drain regions.

14. The semiconductor device according to claim 12, wherein the isolation region is further positioned between punchthrough stop (PTS) doped regions respectively corresponding to the adjacent active gate regions of each fin.

15. The semiconductor device according to claim 11, further comprising additional isolation regions on the substrate corresponding to the adjacent active gate regions, wherein the additional isolation regions have top surfaces adjacent bottom portions of the fin channel regions.

16. The semiconductor device according to claim 15, wherein:
a height of the isolation region is greater than a height of each of the additional isolation regions; and
a difference between the height of the isolation region and the height of each of the additional isolation regions is equal to or substantially equal to a thickness of the fin channel regions.

17. The semiconductor device according to claim 10, wherein a height of the isolation region with respect to the substrate is equal to or substantially equal to a height of each of the plurality of fins with respect to the substrate.

18. The semiconductor device according to claim 10, wherein the isolation region comprises at least one of silicon dioxide ($SiO_2$), low-temperature oxide (LTO), high-temperature oxide (HTO) and field oxide (FOX).

* * * * *